(12) United States Patent
Ohta et al.

(10) Patent No.: US 11,067,648 B2
(45) Date of Patent: *Jul. 20, 2021

(54) MAGNETIC SENSOR AND METHOD OF MANUFACTURING THE SAME

(71) Applicant: TDK Corporation, Tokyo (JP)

(72) Inventors: Naoki Ohta, Tokyo (JP); Keisuke Takasugi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,546

(22) Filed: Nov. 25, 2019

(65) Prior Publication Data

US 2020/0096578 A1    Mar. 26, 2020

Related U.S. Application Data

(63) Continuation of application No. 15/676,117, filed on Aug. 14, 2017, now Pat. No. 10,527,687.

(30) Foreign Application Priority Data

Feb. 22, 2017 (JP) .............................. JP2017-031115

(51) Int. Cl.
*G01R 33/09* (2006.01)
*G01R 33/00* (2006.01)
(Continued)

(52) U.S. Cl.
CPC ....... *G01R 33/093* (2013.01); *G01R 33/0052* (2013.01); *G01R 33/05* (2013.01); *H01R 43/12* (2013.01)

(58) Field of Classification Search
CPC .. G01R 33/093; G01R 33/0052; G01R 33/05; H01R 43/12; H01R 43/00
See application file for complete search history.

(56) References Cited

U.S. PATENT DOCUMENTS

| 4,891,567 A | 1/1990 | Fujitani et al. |
| 6,486,662 B1 | 11/2002 | Ruigrok et al. |

(Continued)

FOREIGN PATENT DOCUMENTS

| CN | 102337541 A | 2/2012 |
| CN | 105259518 A | 1/2016 |

(Continued)

OTHER PUBLICATIONS

Office action dated Mar. 20, 2018 issued in corresponding JP patent application No. 2017-031115 (English translation only).

(Continued)

*Primary Examiner* — Dominic E Hawkins
(74) *Attorney, Agent, or Firm* — Posz Law Group, PLC

(57) ABSTRACT

A magnetic sensor that ensures the height of the yoke and that guides magnetic flux in the direction in which the magnetic field sensing film detects a magnetic field includes a first magnetic field detection element that has a first magnetic field sensing film that detects a magnetic field in a first direction, and a first yoke that includes a first portion that is located on a side of the first magnetic field sensing film with respect to the first direction, and a second portion that is in contact with the first portion in a direction that is orthogonal to the first direction. The average dimension of the second portion in the first direction is larger than the average dimension of the first portion in the first direction.

8 Claims, 9 Drawing Sheets

(51) Int. Cl.
*G01R 33/05* (2006.01)
*H01R 43/12* (2006.01)

(56) References Cited

U.S. PATENT DOCUMENTS

| | | |
|---|---|---|
| 6,937,434 B2 | 8/2005 | Takahashi |
| 8,797,692 B1 | 8/2014 | Guo et al. |
| 9,123,359 B1 | 9/2015 | Han et al. |
| 10,527,687 B2 * | 1/2020 | Ohta ................ G01R 33/093 |
| 2003/0123198 A1 | 7/2003 | Sugawara et al. |
| 2011/0215800 A1 | 9/2011 | Zhou et al. |
| 2011/0273174 A1 | 11/2011 | Imatani et al. |
| 2011/0298070 A1 * | 12/2011 | Fukui ................ H01L 43/12 257/422 |
| 2011/0309829 A1 | 12/2011 | Loreit et al. |
| 2015/0028863 A1 | 1/2015 | Zeyen |
| 2016/0109534 A1 | 4/2016 | Dieny et al. |
| 2016/0320460 A1 | 11/2016 | Mather et al. |
| 2017/0160351 A1 | 6/2017 | Yamamoto et al. |
| 2017/0328963 A1 | 11/2017 | Schmitt et al. |
| 2018/0321334 A1 | 11/2018 | Deak et al. |

FOREIGN PATENT DOCUMENTS

| | | |
|---|---|---|
| DE | 10 2009 008 265 A1 | 8/2010 |
| DE | 10 2014 116 953 A1 | 5/2016 |
| JP | 549-135587 A | 12/1974 |
| JP | H07-210833 A | 8/1995 |
| JP | 2005-012065 A | 1/2005 |
| JP | 2005-159273 A | 6/2005 |
| JP | 2013-172040 A | 9/2013 |
| JP | 2015-094732 A | 5/2015 |
| JP | 2017-005096 A | 1/2017 |
| WO | 2011/068146 A1 | 6/2011 |
| WO | 2015/170509 A1 | 11/2015 |

OTHER PUBLICATIONS

Office Action dated on Mar. 30, 2021 issued in corresponding to CN patent application No. 201711159781.9 (English translation only).

* cited by examiner

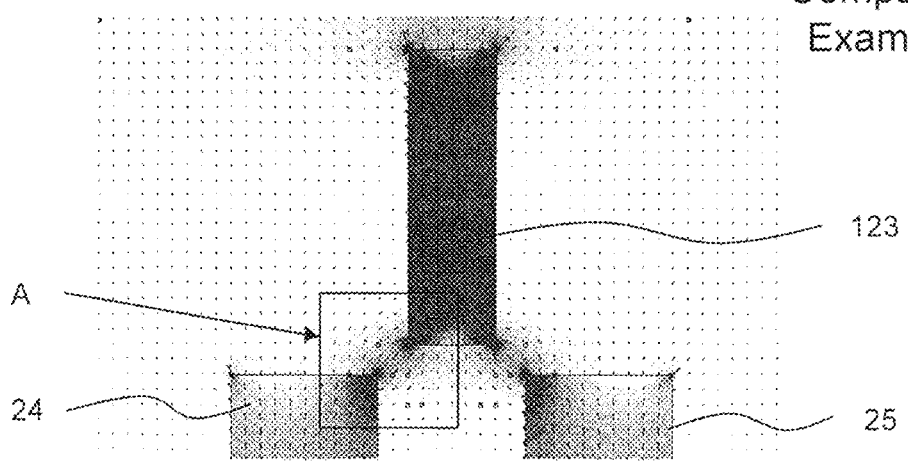
Fig.9A  Comparative Example 1
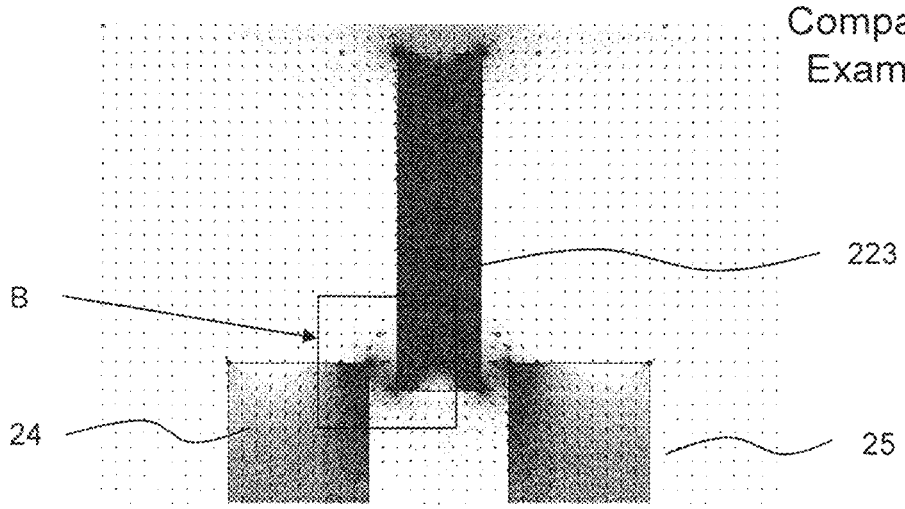
Fig.9B  Comparative Example 2
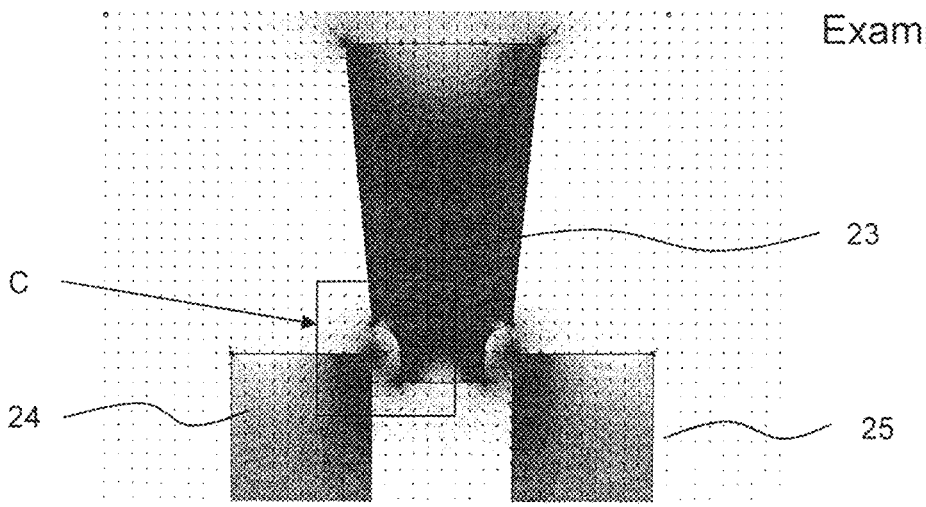
Fig.9C  Example

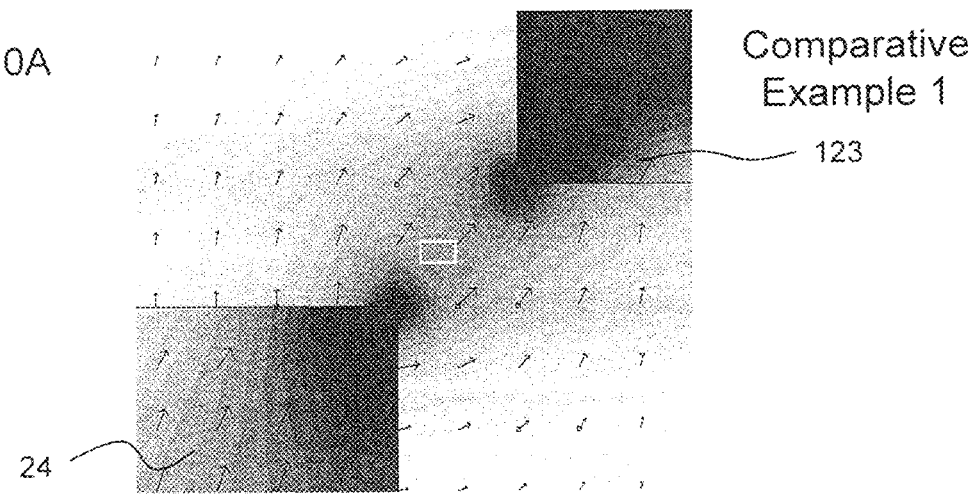
Fig.10A  Comparative Example 1
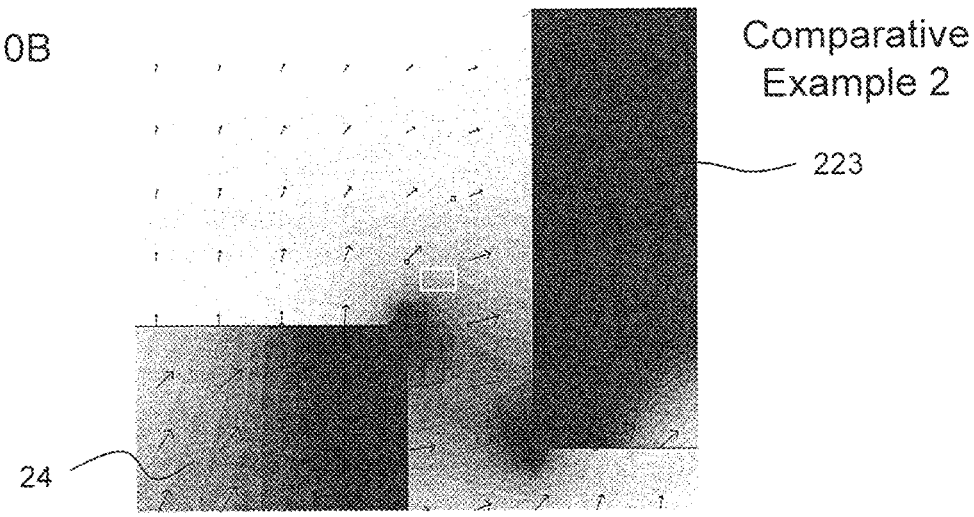
Fig.10B  Comparative Example 2
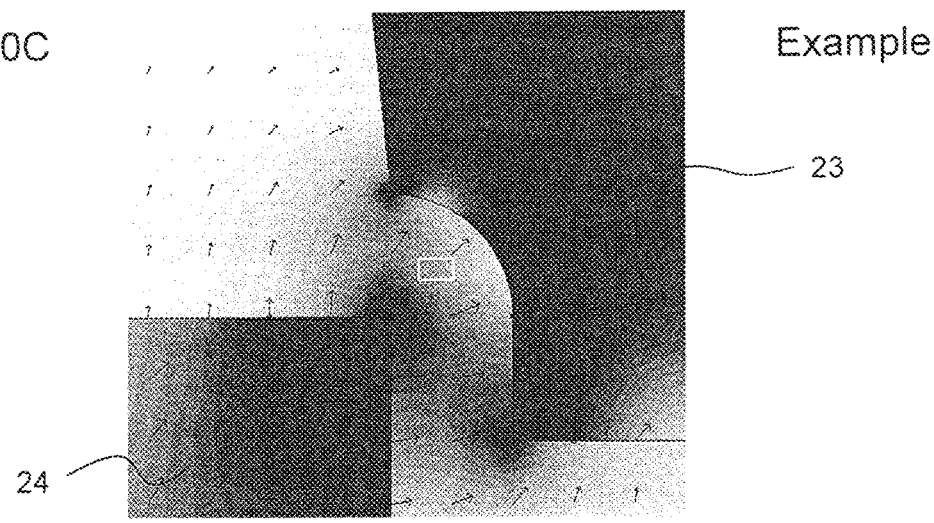
Fig.10C  Example

MAGNETIC SENSOR AND METHOD OF MANUFACTURING THE SAME

CROSS REFERENCE TO RELATED APPLICATIONS

The present application is a continuation application of U.S. Utility application Ser. No. 15/676,117 filed on Aug. 14, 2017, which is based on Japanese Patent Application No. 2017-031115 filed on Feb. 22, 2017, the contents of which are incorporated herein by reference.

BACKGROUND OF THE INVENTION

Field of the Invention

The present invention relates to a magnetic sensor and a method of manufacturing the same, and particularly to the configuration of a yoke of the magnetic sensor.

A magnetic sensor may be provided with a yoke near a magnetic field sensing film in order to guide magnetic flux in the magnetic field sensing direction of the magnetic field sensing film. JP2013-172040A, JP2015-94732A and WO 2011/68146 disclose a magnetic sensor in which a yoke is arranged near a magnetic field sensing film that detects a magnetic field in a first direction. The yoke extends in a second direction that is orthogonal to the first direction. The magnetic flux emitted from an end portion of the yoke has a component in the first direction, and the magnetic field sensing film detects the component in the first direction. A plurality of magnetic field sensing films is formed in the first direction, and the yokes and the magnetic field sensing films are alternately arranged.

WO 2015/170509 and JP7-210833 disclose a magnetic sensor in which an end portion of the yoke that is close to a magnetic field sensing film is formed in a tapered shape.

In order to guide magnetic flux in a first direction, it is desirable that the end portion of a yoke be provided on a side of a magnetic field sensing film in the first direction. In order to reduce the size of a magnetic sensor, it is desirable to reduce as much as possible the arrangement space in the first direction for arranging the magnetic field sensing films and the end portions of the yokes that are adjacent to each other. On the other hand, in order to increase magnetic flux density of the yoke, it is effective to increase the height of the yoke, or a dimension of the yoke in the second direction. The yoke is formed by means of plating in the wafer process. Therefore, plating needs to be formed in a narrow and deep hole on the side of the magnetic field sensing film. However, such a plating process is disadvantageous in term of ensuring the accuracy with which the plating is formed.

It is an object of the present invention to provide a magnetic sensor that is easy to ensure the height of the yoke and that is also easy to guide magnetic flux in the direction in which the magnetic field sensing film detects a magnetic field.

SUMMARY OF THE INVENTION

A magnetic sensor of the present invention includes: a first magnetic field detection element that has a first magnetic field sensing film that detects a magnetic field in a first direction; and a first yoke that includes a first portion that is located on a side of the first magnetic field sensing film with respect to the first direction and a second portion that is in contact with the first portion in a direction that is orthogonal to the first direction. The average dimension of the second portion in the first direction is larger than the average dimension of the first portion in the first direction.

According to the present invention, the first portion of the first yoke is located substantially on the side of the first magnetic field sensing film in the first direction. As a result, it is easy to guide magnetic flux to the direction in which first magnetic field sensing film detects the magnetic field. The average dimension of the second portion in the first direction is larger than the average dimension of the first portion in the first direction. Therefore, the hole of the resist in which the second portion is to be formed can be formed wide enough to ensure the accuracy with which plating is formed. Accordingly, the present invention provides a magnetic sensor that is easy to ensure the height of the yoke and that is also easy to guide magnetic flux in the direction in which the magnetic field sensing film detects a magnetic field.

BRIEF DESCRIPTION OF THE DRAWINGS

FIGS. 9A to 9C are results of simulating magnetic field in Comparative Examples 1, 2 and Example, respectively; and FIGS. 10A to 10C are partial enlarged views of FIGS. 9A to 9C, respectively.

DETAILED DESCRIPTION OF THE PREFERRED EMBODIMENTS

Figure 1:
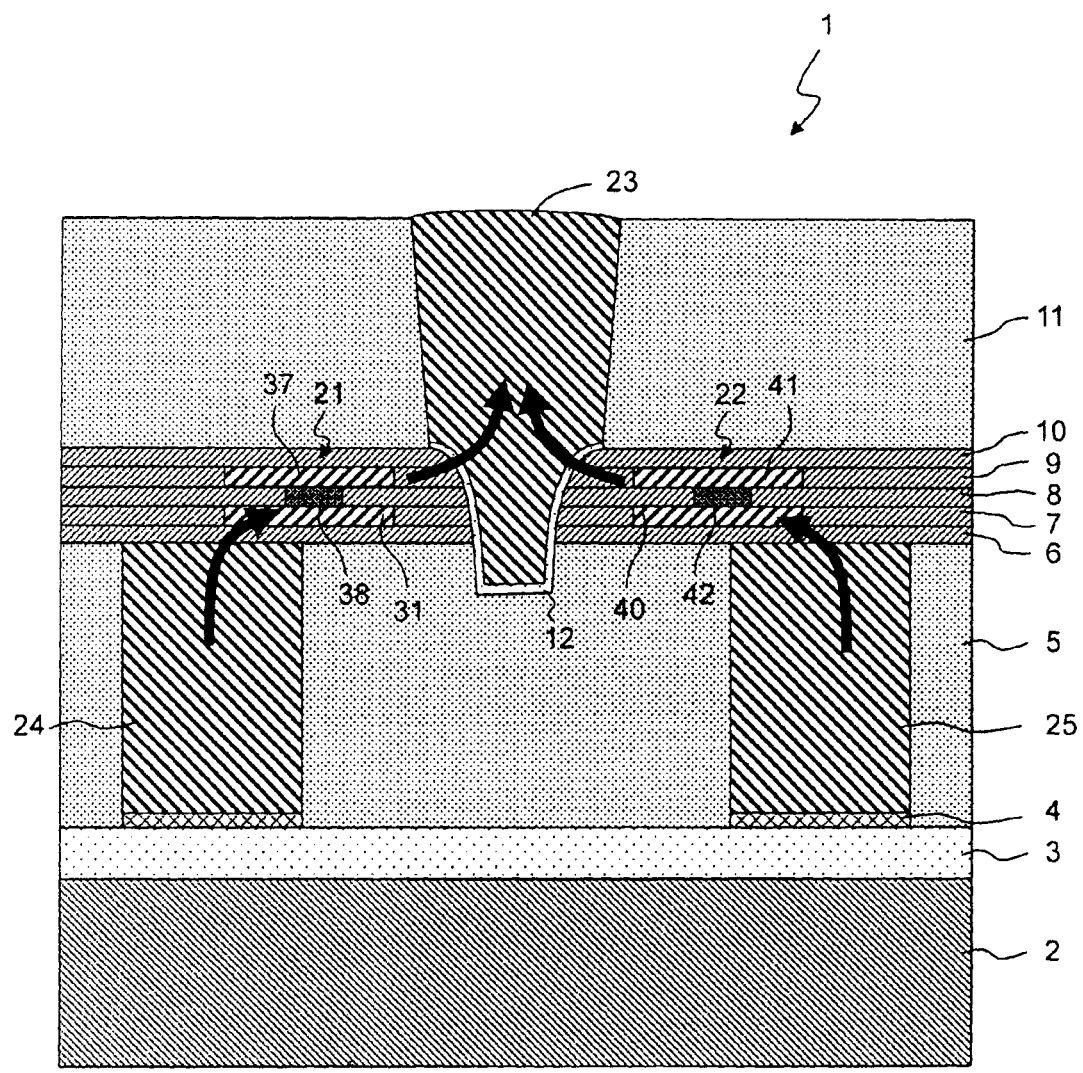
FIG. 1 is a partial cross sectional view illustrating a magnetic sensor according to a first embodiment of the present invention.
Figure 1:
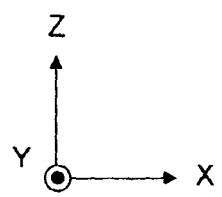
Figure 2:
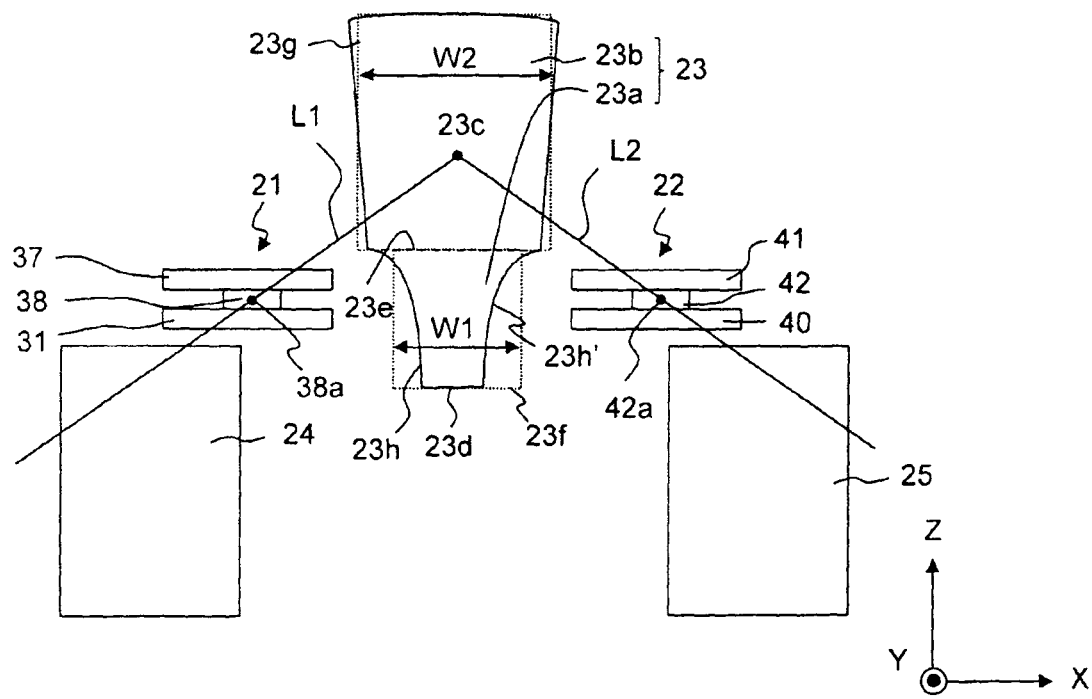
FIG. 2 are diagrams illustrating only yokes and magnetic field detection elements in FIG. 1.

Hereinafter, some embodiments of the present invention will be described with reference to the drawings. FIG. 1 is a partial cross-sectional view illustrating a magnetic sensor according to a first embodiment of the present invention. Magnetic sensor 1 has a plurality of magnetic field detection elements and a plurality of yokes. The yoke guides magnetic flux in the magnetic field sensing direction of the magnetic field detection element, and the magnetic flux that is guided in the magnetic field sensing direction by the yoke is detected by the magnetic field detection element. The magnetic field detection elements are interconnected by a bridge circuit (not illustrated) or the like, and thereby magnetic sensor 1 can measure external magnetic field. FIG. 1 illustrates magnetic sensor 1 that includes first and second magnetic field detection elements 21, 22 that are adjacent to each other and first to third yokes 23, 24, 25 that are arranged near magnetic field detection elements 21, 22. FIG. 2 is a diagram illustrating only first and second magnetic field detection elements 21, 22 and first to third yokes 23, 24, 25 in FIG. 1, for convenience of description.

In the following description, the first direction is a magnetic field sensing direction in which first and second magnetic field sensing films 38, 42 detect a magnetic field. The first direction also corresponds to the direction in which first magnetic field sensing film 38 and second magnetic field sensing film 42 are arranged. The second direction is orthogonal to the first direction. The second direction corresponds to the direction in which upper lead 37 and lower lead 31 of first magnetic field detection element 21 are arranged. The second direction also corresponds to the direction in which upper lead 41 and lower lead 40 of second magnetic field detection element 22 are arranged. The first direction is orthogonal to the film thickness direction of first and second magnetic field sensing films 38, 42, and the second direction is parallel to the film thickness direction of first and second magnetic field sensing films 38, 42. The third direction is orthogonal both to the first direction and to the second direction. The first direction, the second direction and the third direction may be referred to as direction X, direction Z and direction Y, respectively. Note that that the magnetic flux is assumed to flow from second and third yokes 24, 25 to first yoke 23 in the present embodiment, but there is no difference in the configuration and effect of the present embodiment even when the magnetic flux flows from first yoke 23 to second and third yokes 24, 25.

Magnetic sensor 1 includes substrate 2, second and third yokes 24, 25 that are formed on substrate 2 via first insulation layer 3, first and second magnetic field detection elements 21, 22 that are provided above second and third yokes 24, 25, and first yoke 23 that is provided between first magnetic field detection element 21 and second magnetic field detection element 22 with regard to first direction X. First to third yokes 23, 24, 25 are formed of a soft magnetic material, such as NiFe. First electrode films 4 that are formed in a plating step are provided between first insulation layer 3 and second and third yokes 24, 25.

First magnetic field detection element 21 includes first magnetic field sensing film 38 that detects a magnetic field in first direction X and a pair of first leads 31, 37. First leads 31, 37 sandwich first magnetic field sensing film 38 in second direction Z and supply sense current to first magnetic field sensing film 38. Second magnetic field detection element 22 includes second magnetic field sensing film 42 that detects a magnetic field in first direction X and a pair of second leads 40, 41. Second leads 40, 41 sandwich second magnetic field sensing film 42 in second direction Z and supply sense current to second magnetic field sensing film 42. The sense current flows in second direction Z. Hereinafter, the leads of the pairs of first and second leads on the side of substrate 2 are referred to as lower leads 31, 40, respectively, and the leads on the side opposite to lower leads 31, 40 with respect to first and second magnetic field sensing films 38, 42 are referred to as upper leads 37, 41, respectively. Second magnetic field detection element 22 is arranged away from first magnetic field detection element 21 in first direction X. First magnetic field sensing film 38 and second magnetic field sensing film 42 are provided at symmetrical positions with respect to the center line of first yoke 23 in direction Z.

First yoke 23 is provided between second yoke 24 and third yoke 25 with respect to direction X and between first magnetic field sensing film 38 and second magnetic field sensing film 42. More specifically, second yoke 24 is located on the side opposite to first yoke 23 with respect to first magnetic field sensing film 38 and lies on an extended line of straight line L1 that connects center 23c of first yoke 23 to center 38a of first magnetic field sensing film 38. Third yoke 25 is located on the side opposite to first yoke 23 with respect to second magnetic field sensing film 42 and lies on an extended line of straight line L2 that connects center 23c of first yoke 23 to center 42a of second magnetic field sensing film 42. Centers 23c, 38a, 42a are synonymous with the center of gravity. FIG. 1 schematically illustrates the flow of magnetic flux that passes through first to third yokes 23, 24, 25. The magnetic flux emitted from second and third yokes 24, 25 proceeds in the oblique and upward direction in FIG. 1 and is absorbed in first yoke 23. Specifically, the magnetic flux that proceeds in second and third yokes 24, 25 in direction Z changes its direction such that the direction has direction X component between second and third yokes 24, 25 and first yoke 23 before being absorbed in first yoke 23, and then proceeds in first yoke 23 in direction Z. First magnetic field sensing film 38 is positioned in the area between first yoke 23 and second yoke 24 that has large direction X component of the magnetic flux, and therefore the magnetic flux in direction X can be efficiently detected. The same applies to second magnetic field sensing film 42.

Second insulation layer 5 is formed on the sides of second and third yokes 24, 25. Third insulation layer 7 is formed on the sides of lower leads 31, 40. Fourth insulation layer 8 is formed on the sides of first and second magnetic field sensing films 38, 42. Fifth insulation layer 9 is formed on the sides of upper leads 37, 41. Sixth insulation layer 11 is formed on the sides of second portion 23b of first yoke 23 (later described). First intermediate insulation layer 6 is formed between second and third yokes 24, 25 and lower leads 31, 40. Second intermediate insulation layer 10 is formed between upper leads 37, 41 and sixth insulation layer 11. First to sixth insulation layers 3, 5, 7, 8, 9, 11, and first and second intermediate insulation layers 6, 10 are formed of $Al_2O_3$. Note that first intermediate insulation layer 6 is a support layer that supports first and second magnetic field detection elements 21, 22.

Figure 3:
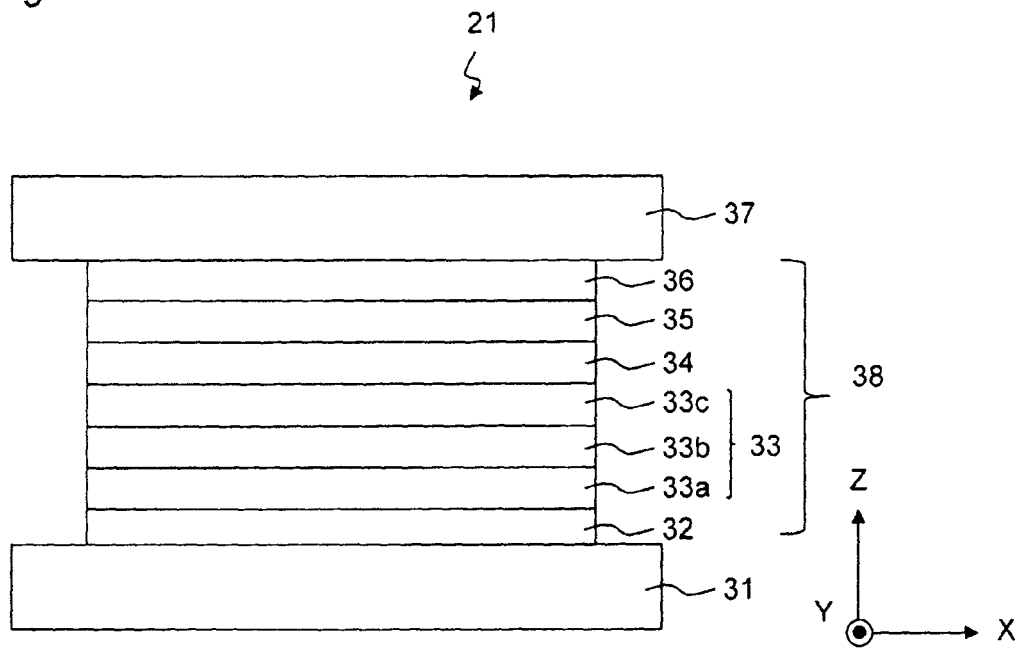
FIG. 3 is a schematic diagram illustrating the configuration of first and second magnetic field detection elements.

Next, first and second magnetic field detection elements 21, 22 will be described. Since first magnetic field detection element 21 and second magnetic field detection element 22 have the same structure, only first magnetic field detection element 21 is described here. FIG. 3 is a cross-sectional view illustrating the configuration of first magnetic field detection element 21 in more detail. First magnetic field sensing film 38 of first magnetic field detection element 21 includes magnetization free layer 35, magnetization fixed layer 33 and spacer layer 34 that is sandwiched between magnetization free layer 35 and magnetization fixed layer 33. Spacer layer 34 exhibits the magneto-resistive effect. Magnetization free layer 35 is formed of a soft magnetic material, such as NiFe. The magnetization direction of magnetization free layer 35 relative to external magnetic field rotates in a plane that includes first direction X and third direction Y. Magnetization free layer 35 has a sufficiently larger length in direction Y than in direction X so that the magnetization direction is oriented in direction X due to the shape anisotropy effect. Bias layers that are formed of a hard magnetic material may be provided on both sides of magnetization free layer 35 with regard to direction X in order to orient the magnetization direction in direction X. Magnetization fixed layer 33 is formed of a soft magnetic material, such as CoFe, and the magnetization direction is fixed relative to the external magnetic field. Spacer layer 34 is a tunnel barrier layer that is formed of a nonmagnetic insulating material, such as $Al_2O_3$. Accordingly, first magnetic field detection element 21 of the present embodiment is a TMR (Tunnel Magneto Resistive) element, but may also be a so-called GMR (Giant Magneto Resistive) element in which spacer layer 34 is formed of a nonmagnetic metal layer, such as Cu.

Magnetization fixed layer 33 is formed by stacking first magnetization fixed layer 33a, nonmagnetic intermediate layer 33b and second magnetization fixed layer 33c in this order. First magnetization fixed layer 33a is formed on seed layer 32 that is formed of Ta or Ru. Second magnetization fixed layer 33c is in contact with spacer layer 34. First magnetization fixed layer 33a and second magnetization fixed layer 33c are formed of a soft magnetic material, such as CoFe, and nonmagnetic intermediate layer 33b is formed of Ru. First magnetization fixed layer 33a and second magnetization fixed layer 33c are anti-ferromagnetically coupled through nonmagnetic intermediate layer 33b. An antiferromagnetic layer that is formed of IrMn or the like and that is exchange-coupled to first magnetization fixed layer 33a may be provided under first magnetization fixed layer 33a. Magnetization free layer 35 is covered by protective layer 36 that is formed of Ta or the like. Note that first magnetic field detection element 21 and second magnetic field detection element 22 are not limited to the TMR element or the GMR element, and may be of any type of magnetic field detection elements, such as an AMR (An-Isotropic Magneto Resistive) element, as long as they can detect a magnetic field in first direction X.

First yoke 23 is partitioned into first portion 23a and second portion 23b in direction Z. First portion 23a is located substantially halfway between first magnetic field sensing film 38 and second magnetic field sensing film 42. The term "substantially halfway" includes a first case where the center axis of first portion 23a in direction Z is slightly shifted in direction X from the middle point between the center of first magnetic field sensing film 38 and the center of second magnetic field sensing film 42 and a second case where first portion 23a is slightly shifted in direction Z with respect to the center of first magnetic field sensing film 38 and the center of second magnetic field sensing film 42. Second portion 23b is formed farther away from first and second magnetic field sensing films 38, 42 than first portion 23a with respect to direction Z, and is in contact with first portion 23a. First portion 23a extends beyond first and second magnetic field sensing films 38, 42 in direction Z, when viewed from second portion 23b. In other words, end 23d of first portion 23a, which is on a side opposite to second portion 23b, faces second and third yokes 24, 25 in first direction X. End 23e of first portion 23a that is connected to second portion 23b is located on the side of second portion 23b with regard to first and second magnetic field sensing films 38, 42, as seen in direction Z, and end 23d of first portion 23a is located on the side opposite to second portion 23b with regard to first and second magnetic field sensing films 38, 42, as seen in direction Z. That is, first portion 23a passes through between first magnetic field sensing film 38 and second magnetic field sensing film 42, and a part of first portion 23a extends beyond first and second magnetic field sensing films 38, 42, as seen in direction Z from second portion 23b. However, when the magnetic flux component in direction X is large enough, first portion 23a may terminate on the side of second portion 23b with regard to first magnetic field sensing film 38 and second magnetic field sensing film 42. Second electrode film 12 that is formed in the plating step is provided on the outer periphery of first portion 23a.

The dimension of first yoke 23 in direction X monotonically increases from below to above in direction Z in FIG. 2, that is, in a direction away from second and third yokes 24, 25 or substrate 2. Accordingly, the average dimension of second portion 23b in direction X is larger than the average dimension of first portion 23a in direction X. The average dimension of first portion 23a in direction X means the average value of the dimension of first portion 23a that is calculated in direction Z. In other words, the average dimension of first portion 23a in direction X means X direction width W1 of virtual rectangle 23f that has the same area and the same dimension in direction Z as first portion 23a in FIG. 2. Similarly, the average dimension of second portion 23b in direction X means the average value of the dimension of second portion 23b that is calculated in direction Z. In other words, the average dimension of second portion 23b in direction X means X direction width W2 of virtual rectangle 23g that has the same area and the same dimension in direction Z as second portion 23b in FIG. 2. The dimension in direction X of either first portion 23a or second portion 23b may be constant in direction Z, and the dimensions in direction X of both first portion 23a and second portion 23b may be constant in direction Z. In other words, first portion 23a may be the same as the shape of virtual rectangle 23f, and second portion 23b may be the same as the shape of virtual rectangle 23g.

The surfaces of first portion 23a that face first and second magnetic field sensing films 38, 42 have curved surfaces 23h, 23h' that are recessed in a direction of retreating from first and second magnetic field sensing films 38, 42, respectively. The shape of the surfaces are not limited to a curved shape and may be, for example, a planer shape. Curved surfaces 23h, 23h' may only be provided on the side of first magnetic field sensing film 38 or on the side of second magnetic field sensing film 42.

Next, a method of manufacturing magnetic sensor 1 described above will be described with reference to FIGS. 4A to 8B.

Figure 4A:
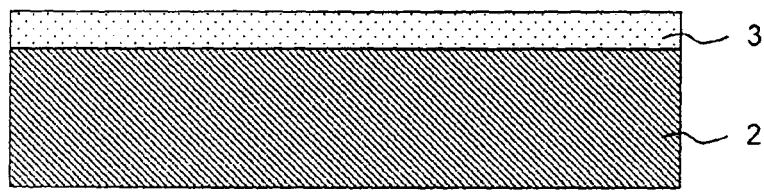
FIGS. 4A to 8B are diagrams illustrating the manufacturing processes of the magnetic sensor in FIG. 1.
Figure 4B:
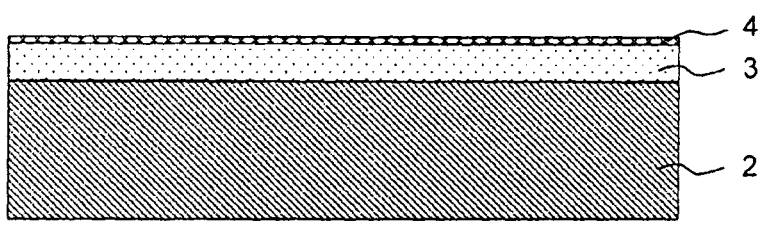
Figure 4C:
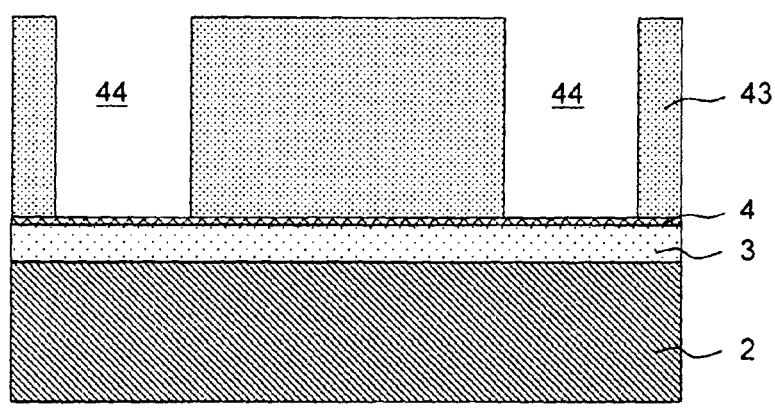
Figure 4D:
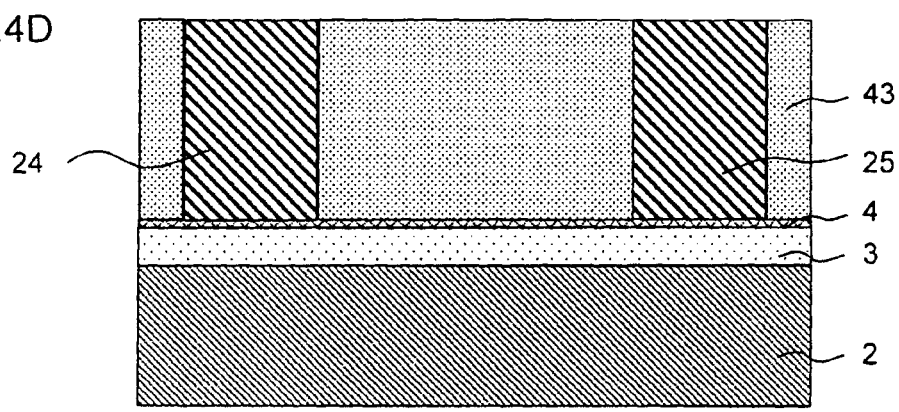

First, first insulation layer 3 is formed on substrate 2, as illustrated in FIG. 4A. Next, first electrode film 4 is formed on first insulation layer 3, as illustrated in FIG. 4B. Then, first photoresist 43 is formed on first electrode film 4, and first holes 44 for forming second and third yokes 24, 25 therein are formed by exposure and development processes, as illustrated in FIG. 4C. Next, second and third yokes 24, 25 are formed in first holes 44 by means of plating, as illustrated in FIG. 4D.

Figure 5A:
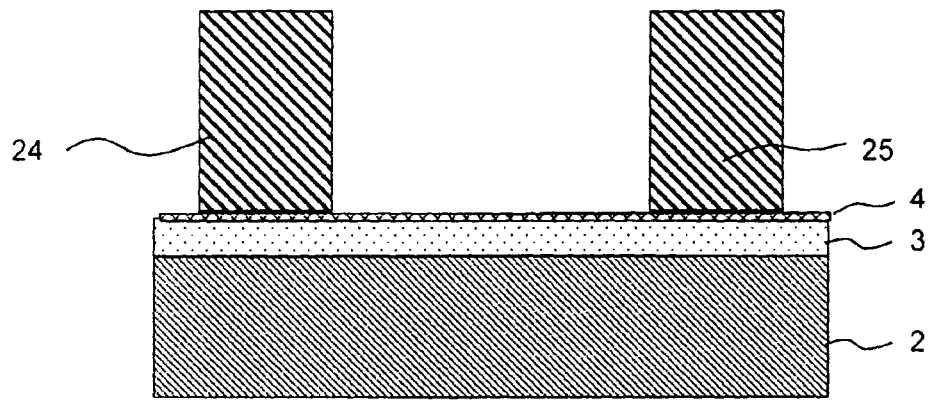
Figure 5B:
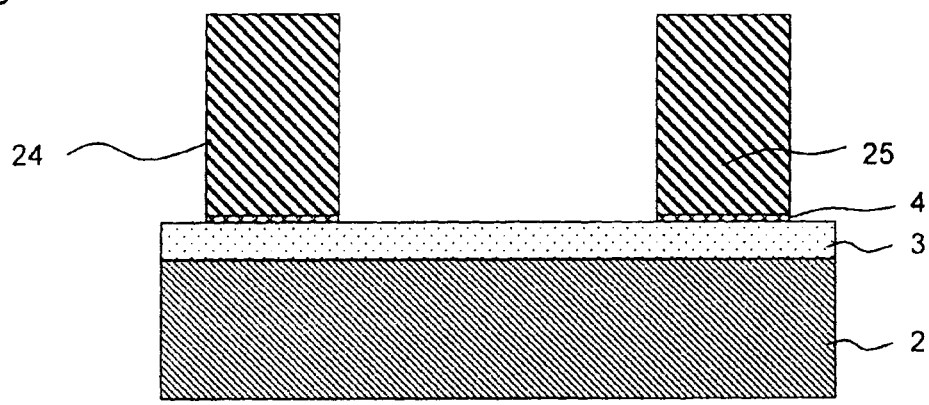
Figure 5C:
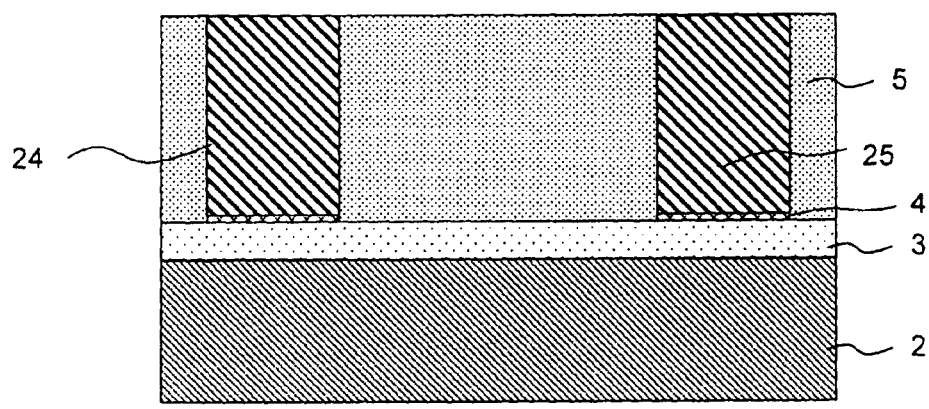

Next, first photoresist 43 is ablated, as illustrated in FIG. 5A. Then, first electrode film 4 is removed by means of milling except for portions where first electrode film 4 is in contact with second and third yokes 24, 2, 5, as illustrated in FIG. 5B. Next, second insulation layer 5 is formed, and second insulation layer 5 that is formed on top of second and third yokes 24, 25 is removed by CMP, as illustrated in FIG. 5C. As a result, the side spaces of second and third yokes 24, 25 are filled with second insulation layer 5.

Figure 6A:
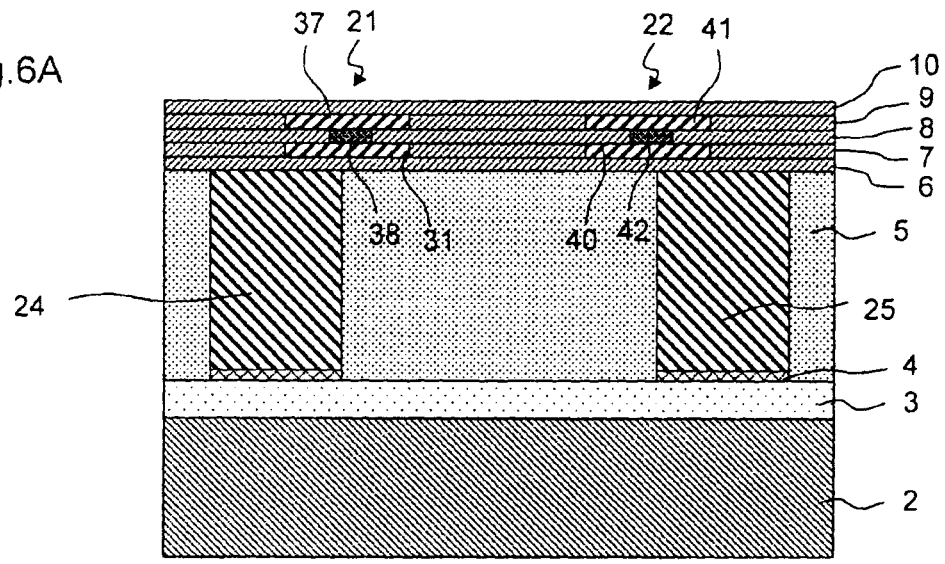
Figure 6B:
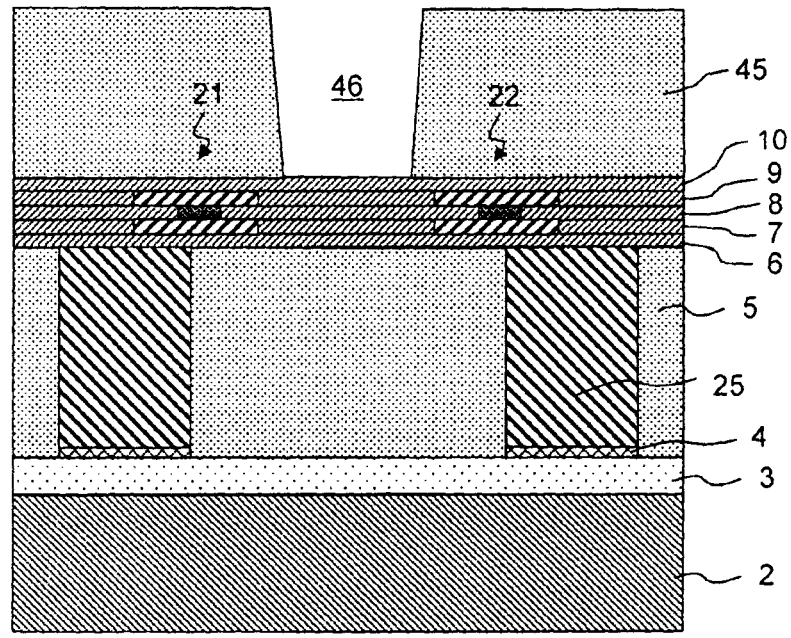

Then, first intermediate insulation layer 6 is formed by means of sputtering on second insulation layer 5, as illustrated in FIG. 6A. Next, lower lead layers 31, 40 of first and second magnetic field detection elements 21, 22 are formed by means of sputtering on first intermediate insulation layer 6 (support layer), and the side spaces of lower lead layers 31, 40 are filled with third insulation layer 7. Next, Magnetic field sensing films 38, 42 of first and second magnetic field detection elements 21, 22 are formed by means of sputtering on lower lead layers 31, 40 of first and second magnetic field detection elements 21, 22, and then the side spaces of magnetic field sensing films 38, 42 are filled with fourth insulation layer 8. Then, upper lead layers 37, 41 of first and second magnetic field detection elements 21, 22 are formed by means of sputtering on magnetic field sensing films 38, 42 of first and second magnetic field detection elements 21, 22, and then the side spaces of upper lead layers 37, 41 are filled with fifth insulation layer 9. Thereafter, second intermediate insulation layer 10 is formed by means of sputtering on upper lead layers 37, 41 of first and second magnetic field detection elements 21, 22 and on fifth insulation layer 9. Next, second photoresist 45 is formed on second intermediate insulation layer 10, and second hole 46 is formed by means of exposure and development processes just above where first portion 23a of first yoke 23 is to be formed, as illustrated in FIG. 6B.

Figure 7A:
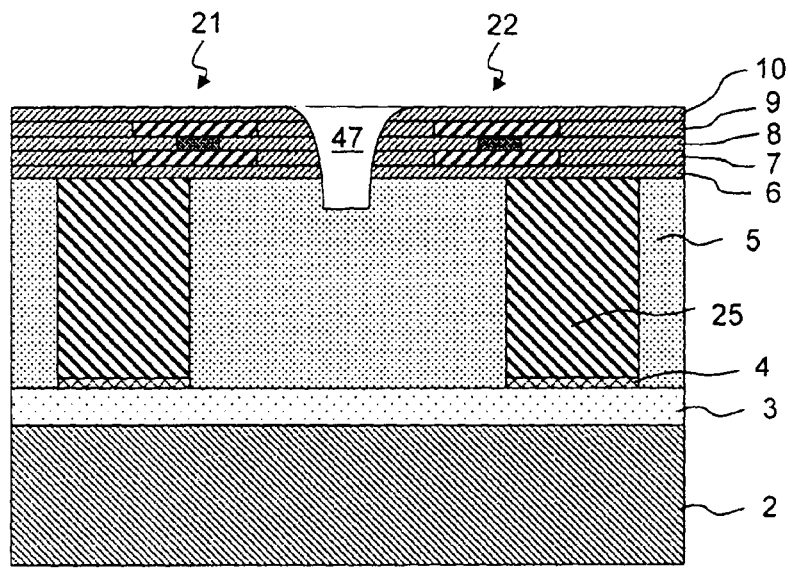
Figure 7B:
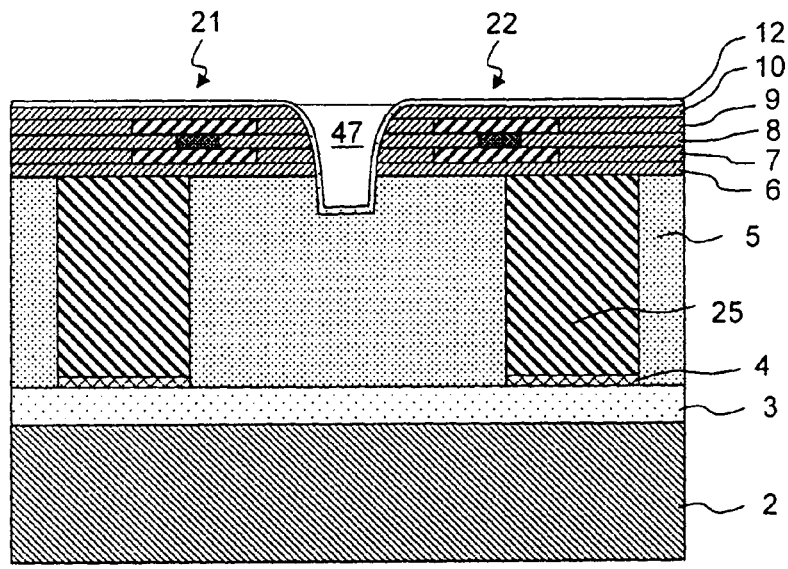

Then, third hole 47 for forming first portion 23a of first yoke 23 is formed by means of milling via second hole 46, and second photoresist 45 is ablated, as illustrated in FIG. 7A. Next, second electrode film 12 is formed on the inner wall of third hole 47 and on second intermediate insulation layer 10, as illustrated in FIG. 7B.

Figure 8A:
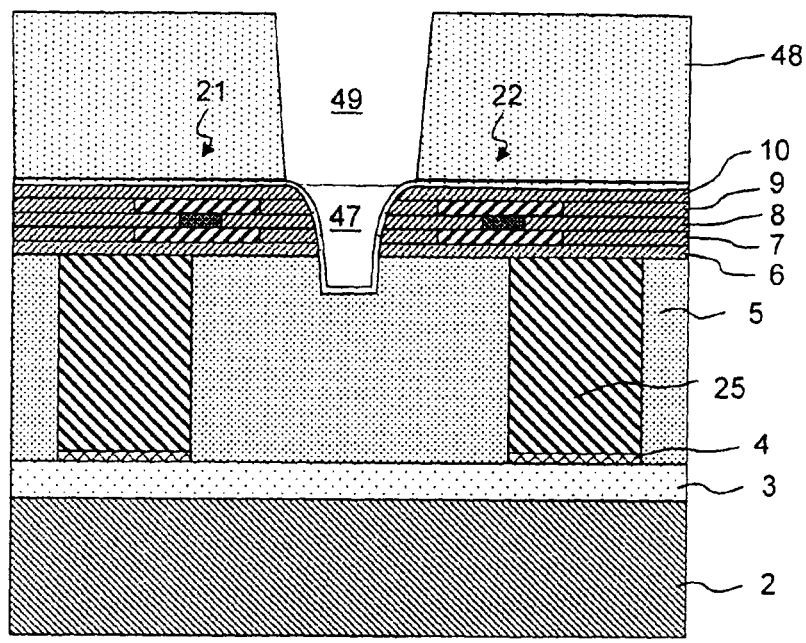
Figure 8B:
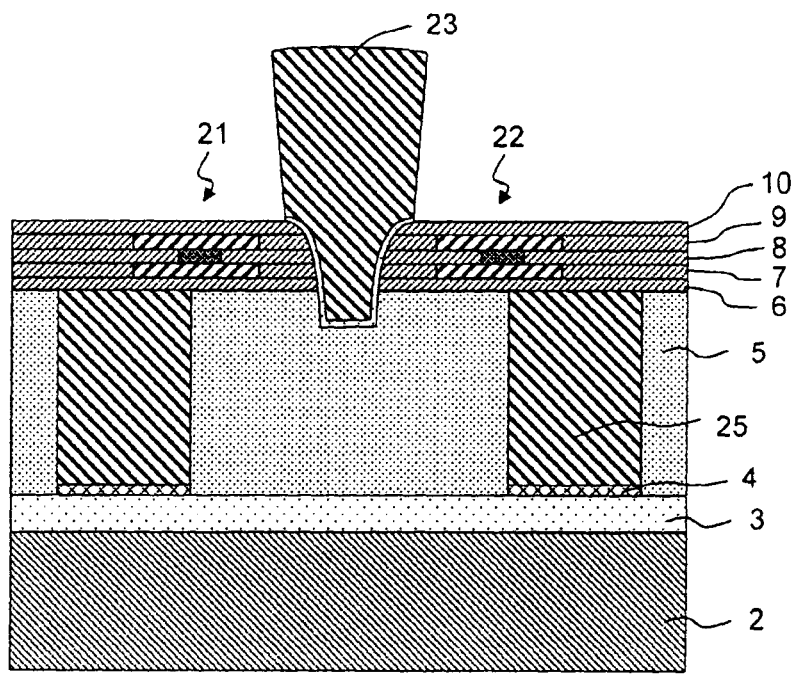

Then, third photoresist 48 is formed, and fourth hole 49 that is connected to third hole 47 is formed by means of exposure and development processes at a portion where second portion 23b of first yoke 23 is to be formed, as illustrated in FIG. 8A. Next, first yoke 23 is formed in third hole 47 and fourth hole 49 by means of plating, as illustrated in FIG. 8B. Then, third photoresist 48 is ablated, second electrode film 12 is removed, and sixth insulation layer 11 is formed on the sides of second portion 23b of first yoke 23, and the configuration illustrated in FIG. 1 is obtained.

FIGS. 9A to 9C show the results of simulating magnetic field in Comparative Examples 1, 2 and Example, respectively. FIGS. 10A, to 10C illustrate enlarged views near first and second magnetic field detection elements 21, 22. FIGS. 10A to 10O illustrate the enlarged views of part A of FIG. 9A, part B of FIG. 9B, and part C of FIG. 9C, respectively. The white square in FIGS. 10A to 10C roughly indicates the position of first magnetic field sensing film 38. FIG. 9A and FIG. 10A show simulation results of Comparative Example 1 in which the lower end of first yoke 123 is located above first magnetic field sensing film 38. The dimension of first yoke 123 in direction X is slightly smaller than the interval between first magnetic field detection element 21 and second magnetic field detection element 22 and is constant in direction Z. In the figure, the length of the arrow indicates the intensity of the magnetic flux, and the direction of the arrow indicates the direction of the magnetic flux. Since first magnetic field sensing film 38 detects a magnetic field of direction X, it is preferred that the arrow be inclined toward direction X as much as possible. FIG. 9B and FIG. 10B show simulation results of Comparative Example 2 in which the lower end of first yoke 223 is located below first magnetic field sensing film 38. As compared to Comparative Example 1, the magnetic flux is further inclined toward direction X at the position of first magnetic field sensing film 38. FIG. 9C and FIG. 10O show a simulation result of Example in which the lower end of first yoke 23 is located below first magnetic field sensing film 38 and the surface of first yoke 23 that faces first magnetic field sensing film 38 is recessed. The magnetic flux is slightly inclined toward direction Z as compared to Comparative Example 2, but is inclined toward direction X as compared to Comparative Example 1.

On the other hand, as described in the above description of the manufacturing method, when first yoke 23 is formed by means of plating, third hole 47 is formed on the sides of first and second magnetic field detection elements 21, 22 in advance, fourth hole 49 is formed in third photoresist 48 in advance, and then first yoke 23 is formed in third and fourth holes 47, 49 by means of plating. Accordingly, in case of Comparative Example 2 in which first yoke 223 has a generally elongate shape, fourth hole 49 is also deep and elongate. However, it will be difficult for the plating process to ensure an accurate shape for holes that are deep and elongate, and this may cause a deterioration in the accuracy with which first yoke 223 is formed. In Example, however, first yoke 23 consists of first portion 23a that has a small dimension in direction X and second portion 23b that has a large dimension in direction X, and accordingly, the dimension of fourth hole 49 in direction X is larger than that of third hole 47, and therefore it is easy to ensure that first yoke 23 is accurately formed.

Thus, a magnetic field sensor can be obtained in the present embodiment in which it is easy to ensure that first yoke 23 is accurately formed and in which magnetic flux is further inclined toward direction X at the positions of first and second magnetic field sensing films 38, 42. Note that magnetic sensor 1 in the above-described embodiment has a plurality of magnetic field detection elements and a plurality of yokes, but in the present invention, one magnetic field detection element and one first yoke 23 are the minimum components, and such a configuration is also included in the present invention.

Reference Signs List

1 Magnetic sensor
21 First magnetic field detection element
22 Second magnetic field detection element
23 First yoke
23a First portion of the first yoke
23b Second portion of the first yoke
24 Second yoke
25 Third yoke
31 Lower lead of the first magnetic field detection element
33 Magnetization fixed layer
34 Spacer layer
35 Magnetization free layer
37 Upper lead of the first magnetic field detection element
38 First magnetic field sensing film
40 Lower lead of the second magnetic field detection element
41 Upper lead of the second magnetic field detection element
42 Second magnetic field sensing film
X First direction
Z Second direction

What is claimed is:

1. A magnetic sensor comprising:
a first magnetic field detection element that has a first magnetic field sensing film that detects a magnetic field in a first direction; and
a yoke that includes a first portion and a second portion that is in contact with the first portion in a direction that is orthogonal to the first direction,
wherein an average dimension of the second portion in the first direction is larger than an average dimension of the first portion in the first direction, and
the yoke is made of a soft magnetic material.

2. The magnetic sensor according to claim 1, wherein the first portion terminates on a side of the second portion with regard to the first magnetic field sensing film, when viewed from the second portion in the direction that is orthogonal to the first direction.

3. The magnetic sensor according to claim 1, wherein
the yoke is a first yoke, and the magnetic sensor further comprises a second yoke that is located on a side opposite to the first yoke with respect to the first magnetic field sensing film, and
the second yoke lies on an extended line of a straight line that connects a center of the first yoke to a center of the first magnetic field sensing film.

4. The magnetic sensor according to claim 1, further comprising a second magnetic field detection element that has a second magnetic field sensing film that detects a magnetic field in the first direction, wherein the second magnetic field detection element is located away from the first magnetic field detection element in the first direction, wherein the first portion is located substantially halfway between the first magnetic field sensing film and the second magnetic field sensing film.

5. The magnetic sensor according to claim 1, wherein a surface of the first portion that faces the first magnetic field sensing film has a curved surface that is recessed in a direction of retreating from the first magnetic field sensing film.

6. The magnetic sensor according to claim 1, wherein the first magnetic field sensing film includes a magnetization free layer in which a magnetization direction relative to external magnetic field rotates in a plane that includes the first direction, a magnetization fixed layer in which a magnetization direction is fixed relative to the external magnetic field, and a spacer layer that is sandwiched between the magnetization free layer and the magnetization fixed layer and that has magnetoresistive effect.

7. The magnetic sensor according to claim 4, wherein the first portion terminates on a side of the second portion with regard to the first magnetic field sensing film and the second magnetic field sensing film, when viewed from the second portion in the direction that is orthogonal to the first direction.

8. The magnetic sensor according to claim 7, further comprising a third yoke that is located on a side opposite to the first yoke with respect to second magnetic field sensing film, the third yoke lying on an extended line of a straight line that connects a center of the first yoke to a center of the second magnetic field sensing film.

\* \* \* \* \*